(12) United States Patent
Mishra et al.

(10) Patent No.: US 11,693,737 B2
(45) Date of Patent: *Jul. 4, 2023

(54) POOLING BLOCKS FOR ERASURE CODING WRITE GROUPS

(71) Applicant: NetApp, Inc., San Jose, CA (US)

(72) Inventors: Sneheet Kumar Mishra, Lafayette, CO (US); Daniel David McCarthy, Erie, CO (US); Christopher Clark Corey, Boulder, CO (US); Austino Nicholas Longo, Lafayette, CO (US); Christopher Cason, Boulder, CO (US)

(73) Assignee: NetApp, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/527,852

(22) Filed: Nov. 16, 2021

(65) Prior Publication Data

US 2022/0075691 A1   Mar. 10, 2022

Related U.S. Application Data

(63) Continuation of application No. 16/858,376, filed on Apr. 24, 2020, now Pat. No. 11,175,989.

(51) Int. Cl.
*G06F 11/10* (2006.01)
*H03M 13/15* (2006.01)
*H03M 7/30* (2006.01)

(52) U.S. Cl.
CPC ....... *G06F 11/1076* (2013.01); *H03M 13/154* (2013.01); *H03M 7/3084* (2013.01)

(58) Field of Classification Search
CPC ............. G06F 11/1076; H03M 13/154; H03M 7/3084

See application file for complete search history.

(56) References Cited

U.S. PATENT DOCUMENTS

| 10,153,781 | B2 | 12/2018 | Owen et al. |
| 10,454,498 | B1* | 10/2019 | Mao ................... H03M 7/6023 |
| 2012/0317334 | A1 | 12/2012 | Suzuki et al. |
| 2014/0201424 | A1 | 7/2014 | Chen et al. |

(Continued)

OTHER PUBLICATIONS

U.S. Notice of Allowance dated Jul. 13, 2021 in U.S. Appl. No. 16/858,376.

*Primary Examiner* — Kyle Vallecillo
(74) *Attorney, Agent, or Firm* — Jaffery Watson Mendonsa & Hamilton LLP

(57) ABSTRACT

A technique provides efficient data protection, such as erasure coding, for data blocks of volumes served by storage nodes of a cluster. Data blocks associated with write requests of unpredictable client workload patterns may be compressed. A set of the compressed data blocks may be selected to form a write group and an erasure code may be applied to the group to algorithmically generate one or more encoded blocks in addition to the data blocks. Due to the unpredictability of the data workload patterns, the compressed data blocks may have varying sizes. A pool of the various-sized compressed data blocks may be established and maintained from which the data blocks of the write group are selected. Establishment and maintenance of the pool enables selection of compressed data blocks that are substantially close to the same size and, thus, that require minimal padding.

20 Claims, 7 Drawing Sheets

(56) References Cited

U.S. PATENT DOCUMENTS

| | | |
|---|---|---|
| 2017/0272100 A1 | 9/2017 | Yanovsky et al. |
| 2018/0075253 A1 | 3/2018 | Auh |
| 2018/0365102 A1 | 12/2018 | Li et al. |
| 2020/0169607 A1* | 5/2020 | Enz .................... H04L 67/1097 |
| 2021/0019066 A1* | 1/2021 | Li ........................ G06F 3/0608 |
| 2021/0334160 A1 | 10/2021 | Mishra et al. |

* cited by examiner

POOLING BLOCKS FOR ERASURE CODING WRITE GROUPS

CROSS-REFERENCE TO RELATED APPLICATIONS

This application is a continuation of U.S. patent application Ser. No. 16/858,376, filed on Apr. 24, 2020, which is hereby incorporated by reference in its entirety for all purposes.

BACKGROUND

Technical Field

The present disclosure relates to protection of data served by storage nodes of a storage cluster and, more specifically, to efficient data protection, such as erasure coding, of data served by the storage nodes of the cluster.

Background Information

A plurality of storage nodes organized as a storage cluster may provide a distributed storage architecture configured to service storage requests issued by one or more clients of the cluster. The storage requests are directed to data stored on storage devices coupled to one or more of the storage nodes. The data served by the storage nodes may be distributed across multiple storage units embodied as persistent storage devices, such as hard disk drives, solid state drives, flash memory systems, or other storage devices. The storage nodes may organize the data stored on the devices as logical volumes (volumes) accessible as logical units (LUNs). Each volume may be implemented as a set of data structures, such as data blocks that store data for the volume and metadata blocks that describe the data of the volume. For example, the metadata may describe, e.g., identify, storage locations on the devices for the data.

Specifically, a volume, such as a LUN, may be divided into data blocks and thereafter compressed to increase (save) storage capacity by, e.g., reducing the number of bits in the block needed to represent the data. To support increased durability of the data, the data blocks of the volume may be further protected by replication or erasure coding of the blocks among the storage nodes. Erasure coding typically requires parity calculations to generate parity blocks using data blocks of a group having the same size. If they are not, smaller sized data blocks may be zero padded to the size of the largest data block in the group. However, the calculated parity blocks are generally not very compressible. As a result, the parity block is as large as the largest data block in the group which, in turn, may negate the benefit of compression.

BRIEF DESCRIPTION OF THE DRAWINGS

The above and further advantages of the embodiments herein may be better understood by referring to the following description in conjunction with the accompanying drawings in which like reference numerals indicate identically or functionally similar elements, of which.

OVERVIEW

The embodiments described herein are directed to a technique configured to provide efficient data protection, such as erasure coding (EC), for content driven distribution of data blocks of logical volumes ("volumes") served by storage nodes of a cluster. A storage node may receive data associated with write requests from clients, wherein the data originate from varying and unpredictable client workload patterns. The data may be received in similar-sized blocks and compressed. A set of the compressed data blocks may be selected to form a write group and an erasure code may be applied to the group to algorithmically generate one or more encoded (e.g., parity) blocks in addition to the data blocks. To be as space efficient as possible with the parity blocks, compressed data blocks of similar size are preferably used to form the write group, which would obviate padding of the data blocks. However, due to the unpredictability of data content and size in client write requests that vary with data workload patterns, the compressed data blocks may have varying sizes.

According to the technique, a collection or "pool" of the various-sized compressed data blocks may be established and maintained from which the data blocks of the write group are selected. Establishment and maintenance of the pool enables selection of compressed data blocks that are substantially close (e.g., based on best-match) to a same size and thus require minimal padding. Compressed data blocks residing in the pool for different periods of time (i.e., blocks having different ages) may be selected for inclusion in a write group of data blocks used to encode a parity block. That is, compressed data blocks of different ages (according a time of reception of associated write requests) may be included in a same write group based on a closest match of size. Notably, a best-match algorithm, e.g., based on size difference for block selection with a bias for older blocks residing longer in the pool, may be performed to select an oldest block of a same size.

Advantageously, the technique described herein is directed to generating parity blocks having sizes that are as small as possible by minimizing the amount of padding needed for the data blocks of the write groups. In addition, maintenance of a pool of various sized data blocks facilitates minimizing of the required padding because data blocks of a substantially similar size may be selected from the pool to form the write groups. In other words, the technique described herein is not concerned with the actual size of the data blocks used to form a write group, but rather that each of the data blocks used to form the group is close to the same size.

DESCRIPTION

Storage Cluster

Figure 1:
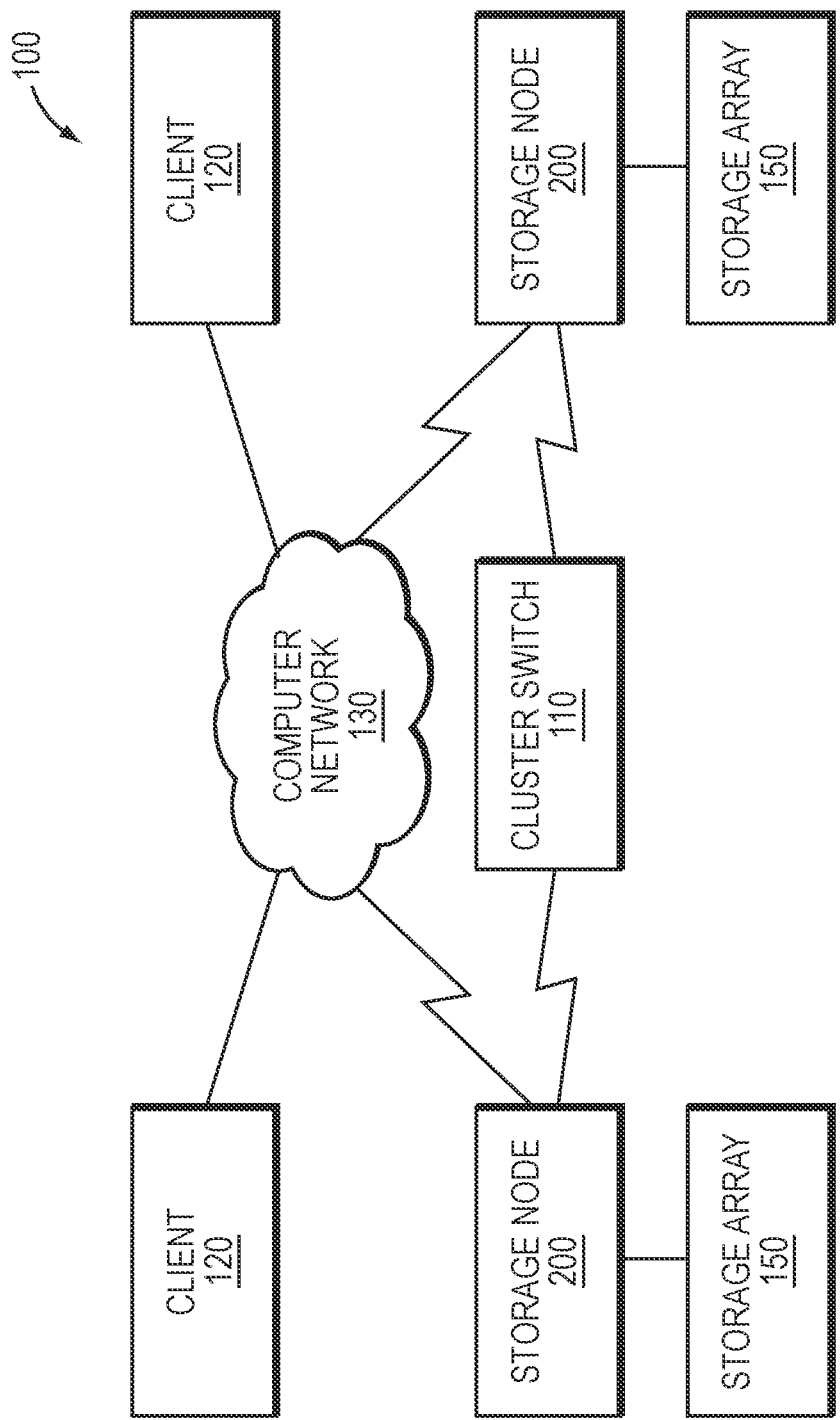
FIG. 1 is a block diagram of a plurality of storage nodes interconnected as a storage cluster.

FIG. 1 is a block diagram of a plurality of storage nodes 200 interconnected as a storage cluster 100 and configured to provide storage service for information, i.e., data and metadata, organized and stored on storage devices of the cluster. The storage nodes 200 may be interconnected by a cluster switch 110 and may include functional components that cooperate to provide a distributed, scale-out storage architecture of the cluster 100. The components of each storage node 200 include hardware and software functionality that enable the node to connect to and service one or more clients 120 over a computer network 130, as well as to a storage array 150 of storage devices, to thereby render the storage service in accordance with the distributed storage architecture.

Each client 120 may be embodied as a general-purpose computer configured to interact with the storage node 200 in accordance with a client/server model of information delivery. That is, the client 120 may request the services of the node 200, and the node may return the results of the services requested by the client, by exchanging packets over the network 130. The client may issue packets including file-based access protocols, such as the Network File System (NFS) and Common Internet File System (CIFS) protocols over the Transmission Control Protocol/Internet Protocol (TCP/IP), when accessing information on the storage node 200 in the form of storage objects, such as files and directories. However, in an embodiment, the client 120 illustratively issues packets including block-based access protocols, such as the Small Computer Systems Interface (SCSI) protocol encapsulated over TCP (iSCSI) and SCSI encapsulated over FC (FCP), when accessing information in the form of storage objects such as logical units (LUNs).

Figure 2:
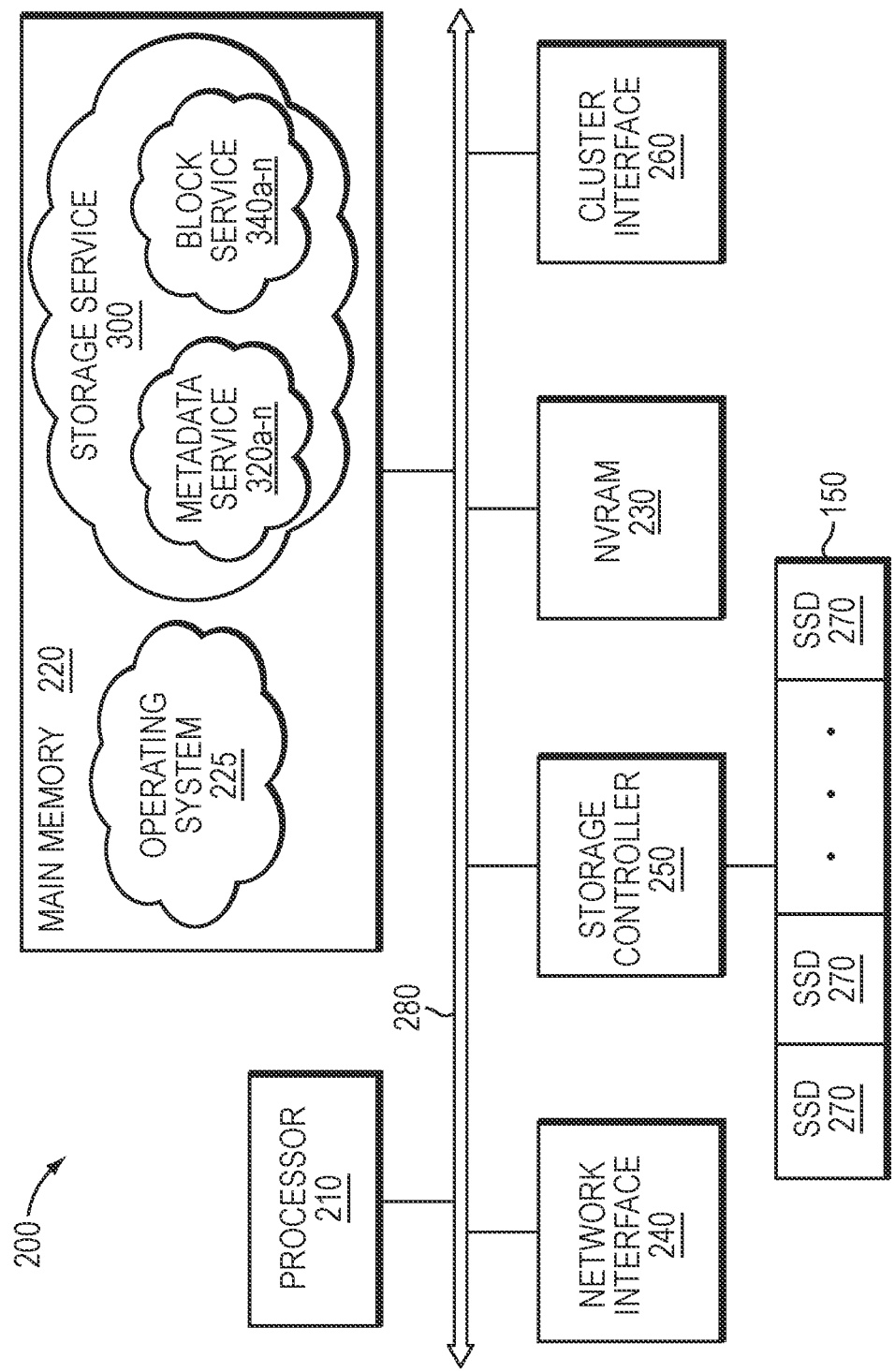
FIG. 2 is a block diagram of a storage node.

FIG. 2 is a block diagram of storage node 200 illustratively embodied as a computer system having one or more processing units (processors) 210, a main memory 220, a non-volatile random access memory (NVRAM) 230, a network interface 240, one or more storage controllers 250 and a cluster interface 260 interconnected by a system bus 280. The network interface 240 may include one or more ports adapted to couple the storage node 200 to the client(s) 120 over computer network 130, which may include point-to-point links, wide area networks, virtual private networks implemented over a public network (Internet) or a shared local area network. The network interface 240 thus includes the mechanical, electrical and signaling circuitry needed to connect the storage node to the network 130, which may embody an Ethernet or Fibre Channel (FC) network.

The main memory 220 may include memory locations that are addressable by the processor 210 for storing software programs and data structures associated with the embodiments described herein. The processor 210 may, in turn, include processing elements and/or logic circuitry configured to execute the software programs, such as one or more metadata services 320a-n and block services 340a-n of storage service 300, and manipulate the data structures. An operating system 225, portions of which are typically resident in memory 220 and executed by the processing elements (e.g., processor 210), functionally organizes the storage node by, inter alia, invoking operations in support of the storage service 300 implemented by the node. A suitable operating system 225 may include a general-purpose operating system, such as the UNIX® series or Microsoft Windows® series of operating systems, or an operating system with configurable functionality such as microkernels and embedded kernels. However, in an embodiment described herein, the operating system is illustratively the Linux® operating system. It will be apparent to those skilled in the art that other processing and memory means, including various computer readable media, may be used to store and execute program instructions pertaining to the embodiments herein. Also, while the embodiments herein are described in terms of software programs, services, code, processes, and computer applications (e.g., stored in memory), alternative embodiments also include the code, services, processes and programs being embodied as logic and/or modules consisting of hardware, software, firmware, or combinations thereof.

The storage controller 250 cooperates with the storage service 300 implemented on the storage node 200 to access information requested by the client 120. The information is preferably stored on storage devices such as internal solid-state drives (SSDs) 270, illustratively embodied as flash storage devices, as well as SSDs of the external storage array 150 (i.e., an additional storage array attached to the node). In an embodiment, the flash storage devices may be block-oriented devices (i.e., drives accessed as blocks) based on NAND flash components, e.g., single-level-cell (SLC) flash, multi-level-cell (MLC) flash or triple-level-cell (TLC) flash, although it will be understood to those skilled in the art that other block-oriented, non-volatile, solid-state electronic devices (e.g., drives based on storage class memory components) may be advantageously used with the embodiments described herein. The storage controller 250 may include one or more ports having I/O interface circuitry that couples to the SSDs 270 over an I/O interconnect arrangement, such as a serial attached SCSI (SAS) and serial ATA (SATA) topology.

The cluster interface 260 may include one or more ports adapted to couple the storage node 200 to the other node(s) of the cluster 100. In an embodiment, dual 10 Gbps Ethernet ports may be used for internode communication, although it will be apparent to those skilled in the art that other types of protocols and interconnects may be utilized within the embodiments described herein. The NVRAM 230 may include a back-up battery or other built-in last-state retention capability (e.g., non-volatile semiconductor memory such as storage class memory) that is capable of maintaining data in light of a failure to the storage node and cluster environment.

Storage Service

Figure 3A:
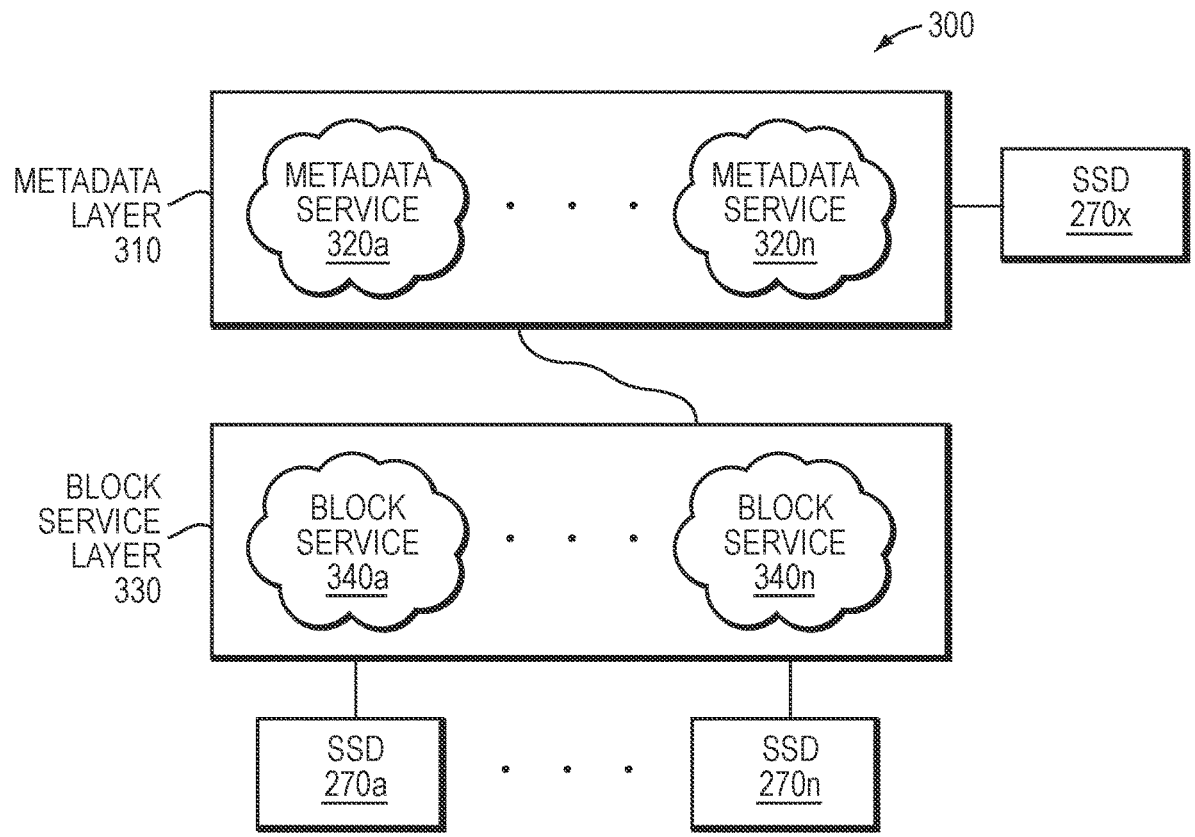
FIG. 3A is a block diagram of a storage service of the storage node.

FIG. 3A is a block diagram of the storage service 300 implemented by each storage node 200 of the storage cluster 100. The storage service 300 is illustratively organized as one or more software modules or layers that cooperate with other functional components of the nodes 200 to provide the distributed storage architecture of the cluster 100. In an embodiment, the distributed storage architecture aggregates and virtualizes the components (e.g., network, memory, and compute resources) to present an abstraction of a single storage system having a large pool of storage, i.e., all storage, including internal SSDs 270 and external storage arrays 150 of the nodes 200 for the entire cluster 100. In other words, the architecture consolidates storage throughout the cluster to enable storage of the LUNs, each of which may be apportioned into one or more logical volumes ("volumes") having a logical block size of either 4096 bytes (4 KB) or 512 bytes. Each volume may be further configured with properties such as size (storage capacity) and performance settings (quality of service), as well as access control, and may be thereafter accessible (i.e., exported) as a block storage pool to the clients, preferably via iSCSI and/or FCP. Both storage capacity and performance may then be subsequently "scaled out" by growing (adding) network, memory and compute resources of the nodes 200 to the cluster 100.

Each client 120 may issue packets as input/output (I/O) requests, i.e., storage requests, to access data of a volume served by a storage node 200, wherein a storage request may include data for storage on the volume (i.e., a write request) or data for retrieval from the volume (i.e., a read request), as well as client addressing in the form of a logical block address (LBA) or index into the volume based on the logical block size of the volume and a length. The client addressing may be embodied as metadata, which is separated from data within the distributed storage architecture, such that each node in the cluster may store the metadata and data on different storage devices (e.g., data on SSDs 270a-n and metadata on SSD 270x) coupled to the node. To that end, the storage service 300 implemented in each node 200 includes a metadata layer 310 having one or more metadata services 320a-n configured to process and store the metadata, e.g., on SSD 270x, and a block server layer 330 having one or more block services 340a-n configured to process and store the data, e.g., on the SSDs 270a-n. For example, the metadata services 320a-n map between client addressing (e.g., LBA indexes) used by the clients to access the data on a volume and block addressing (e.g., block identifiers) used by the block services 340a-n to store and/or retrieve the data on the volume, e.g., of the SSDs.

Figure 3B:
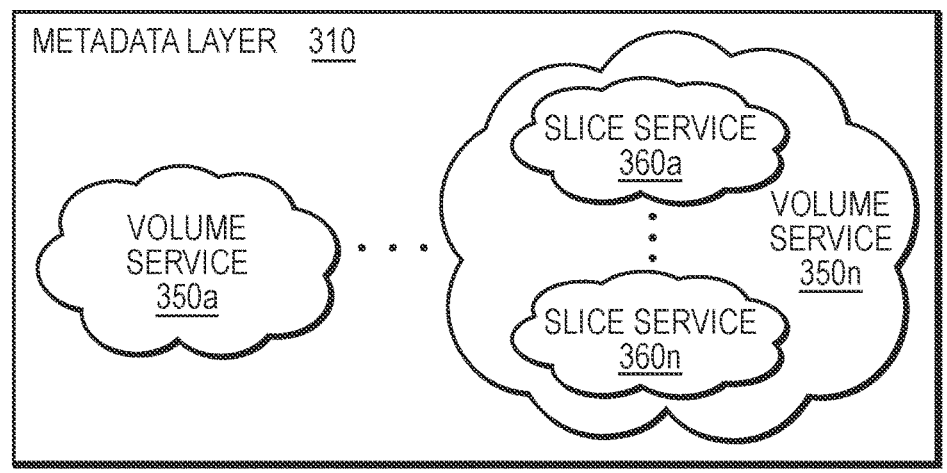
FIG. 3B is a block diagram of an exemplary embodiment of the storage service.

FIG. 3B is a block diagram of an alternative embodiment of the storage service 300. When issuing storage requests to the storage nodes, clients 120 typically connect to volumes (e.g., via indexes or LBAs) exported by the nodes. To provide an efficient implementation, the metadata layer 310 may be alternatively organized as one or more volume services 350a-n, wherein each volume service 350 may perform the functions of a metadata service 320 but at the granularity of a volume, i.e., process and store the metadata for the volume. However, the metadata for the volume may be too large for a single volume service 350 to process and store; accordingly, multiple slice services 360a-n may be associated with each volume service 350. The metadata for the volume may thus be divided into slices and a slice of metadata may be stored and processed on each slice service 360. In response to a storage request for a volume, a volume service 350 determines which slice service 360a-n contains the metadata for that volume and forwards the request to the appropriate slice service 360.

Figure 4:
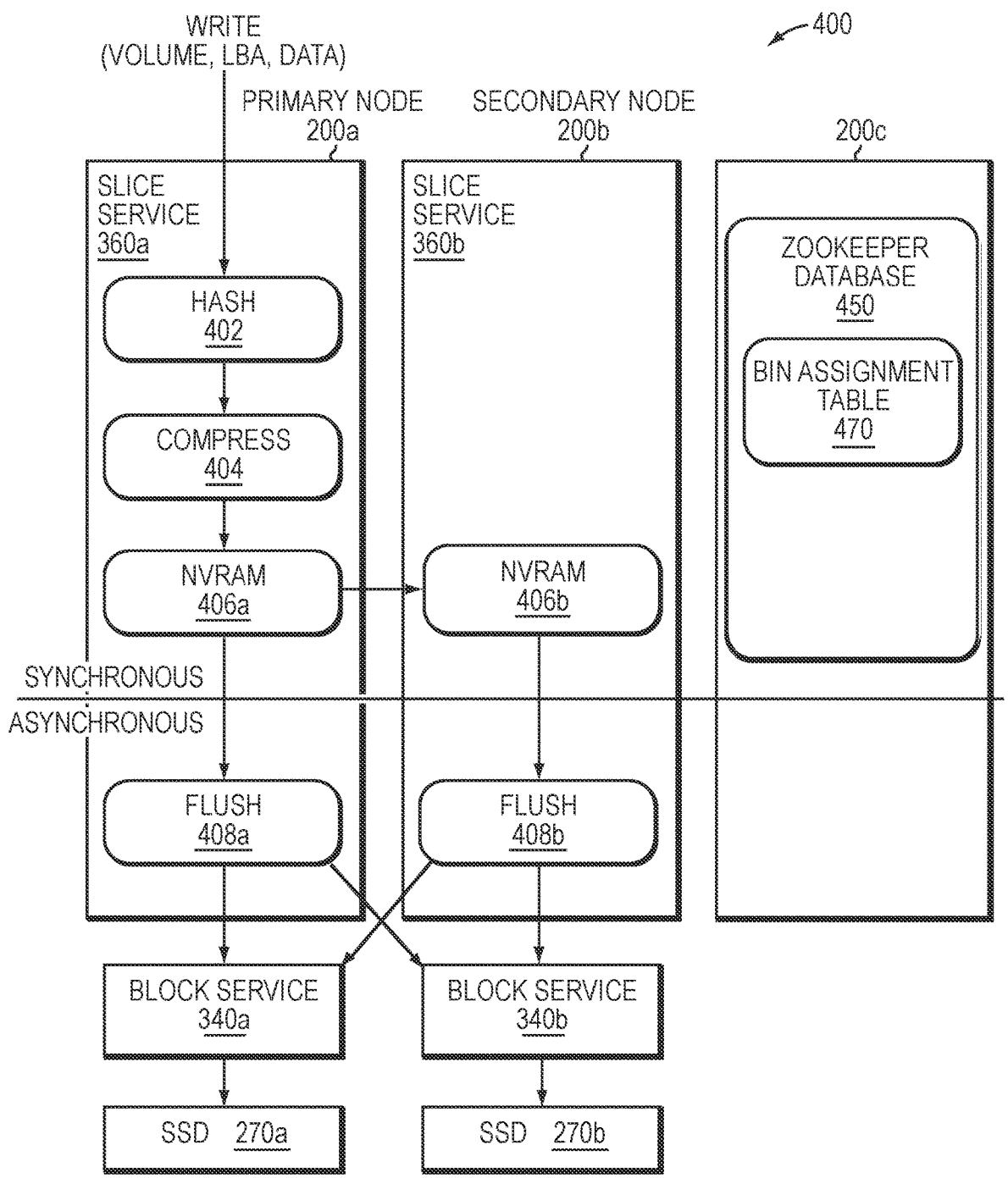
FIG. 4 illustrates a write path of the storage node.

FIG. 4 illustrates a write path 400 of a storage node 200 for storing data on a volume of a storage array 150. In an embodiment, an exemplary write request issued by a client 120 and received at a storage node 200 (e.g., primary node 200a) of the cluster 100 may have the following form:

write (volume, LBA, data)

wherein the volume specifies the logical volume to be written, the LBA is the logical block address to be written, and the data is the actual data to be written. Illustratively, the data received by a slice service 360a of the storage node 200a is divided into 4 KB block sizes. At box 402, each 4 KB data block is hashed using a cryptographic hash function to generate a 128-bit (16 B) hash value (recorded as a block identifier (ID) of the data block); illustratively, the block ID is used to address (locate) the data on the internal SSDs 270 as well as the external storage array 150. A block ID is thus an identifier of a data block that is generated based on the content of the data block. The cryptographic hash function, e.g., Skein algorithm, provides a satisfactory random distribution of bits within the 16 B hash value/block ID employed by the technique. At box 404, the data block is compressed using a compression algorithm, e.g., LZW (Lempel-Zif-Welch), and, at box 406a, the compressed data block is stored in NVRAM 230. Note that, in an embodiment, the NVRAM 230 is embodied as a write cache.

Each compressed data block is then synchronously replicated to the NVRAM 230 of one or more additional storage nodes (e.g., secondary storage node 200b) in the cluster 100 for data protection (box 406b). Although each data block is addressable by its block ID, the size of the data block may not be 4 KB in length due to the compression. For example, the block ID may reference a data block having only 2 KB of compressed data, but once de-compressed, the data block resumes a 4 KB size. After compression, the data blocks may vary in size from, e.g., 1 B to 4 KB, and the BSs may perform operations (as described further herein) on the data blocks using the block ID. An acknowledgement is returned to the client when the data block has been safely and persistently stored in the NVRAM 230a,b of the multiple storage nodes 200a,b of the cluster 100.

Figure 5:
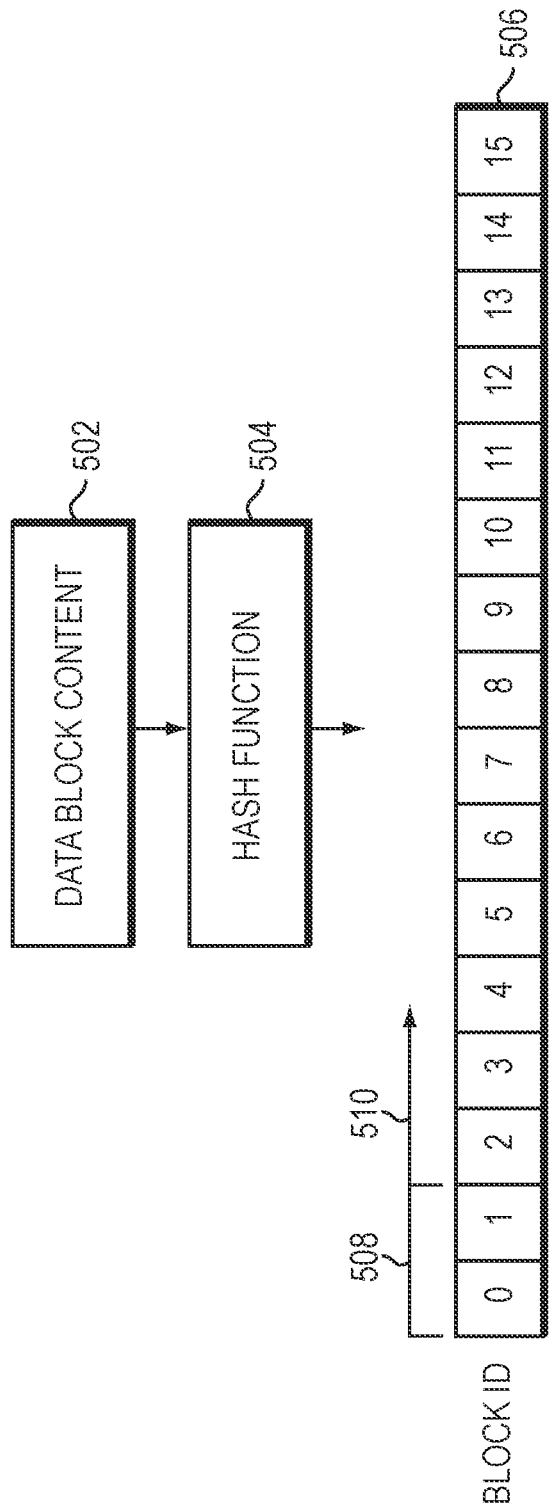
FIG. 5 is a block diagram illustrating details of a block identifier.

FIG. 5 is a block diagram illustrating details of a block identifier. In an embodiment, content 502 for a data block is received by storage service 300. As described above, the received data is divided into data blocks having content 502 that may be processed using hash function 504 to determine block identifiers (IDs). That is, the data is divided into 4 KB data blocks, and each data block is hashed to generate a 16 B hash value recorded as a block ID 506 of the data block; illustratively, the block ID 506 is used to locate the data on one or more storage devices 270 of the storage array 150. The data is illustratively organized within bins that are maintained by a block service 340a-n for storage on the storage devices 270. A bin may be derived from the block ID for storage of a corresponding data block by extracting a predefined number of bits from the block ID 506.

In an embodiment, the bin may be divided into buckets or "sublists" by extending the predefined number of bits extracted from the block ID. For example, a bin field 508 of the block ID may contain the first two (e.g., most significant) bytes (2 B) of the block ID 506 used to generate a bin number (identifier) between 0 and 65,535 (depending on the number of 16 bits used) that identifies a bin. The bin identifier may also be used to identify a particular block service 340a-n and associated SSD 270. A sublist field 510 may then contain the next byte (1 B) of the block ID used to generate a sublist identifier between 0 and 255 (depending on the number of 8 bits used) that identifies a sublist with the bin. Dividing the bin into sublists facilitates, inter alia, network transfer (or syncing) of data among block services in the event of a failure or crash of a storage node. The number of bits used for the sublist identifier may be set to an initial value, and then adjusted later as desired. Each block service 340a-n maintains a mapping between the block ID and a location of the data block on its associated storage device/SSD, i.e., block service drive (BSD).

Illustratively, the block ID (hash value) may be used to distribute the data blocks among bins in an evenly balanced (distributed) arrangement according to capacity of the SSDs, wherein the balanced arrangement is based on "coupling" between the SSDs, i.e., each node/SSD shares approximately the same number of bins with any other node/SSD that is not in a same failure domain, i.e., protection domain, of the cluster. As a result, the data blocks are distributed across the nodes of the cluster based on content (i.e., content driven distribution of data blocks). This is advantageous for rebuilding data in the event of a failure (i.e., rebuilds) so that all SSDs perform approximately the same amount of work (e.g., reading/writing data) to enable fast and efficient rebuild by distributing the work equally among all the SSDs of the storage nodes of the cluster. In an embodiment, each block service maintains a mapping of block ID to data block location on storage devices (e.g., internal SSDs 270 and external storage array 150) coupled to the node.

Illustratively, bin assignments may be stored in a distributed key-value store across the cluster. Referring again to FIG. 4, the distributed key-value storage may be embodied as, e.g., a "zookeeper" database 450 configured to provide a distributed, shared-nothing (i.e., no single point of contention and failure) database used to store bin assignments (e.g., a bin assignment table) and configuration information that is consistent across all nodes of the cluster. In an embodiment, one or more nodes 200c has a service/process associated with the zookeeper database 450 that is configured to maintain the bin assignments (i.e., mappings) in connection with a data structure, e.g., bin assignment table 470. Illustratively the distributed zookeeper is resident on up to, e.g., five (5) selected nodes in the cluster, wherein all other nodes connect to one of the selected nodes to obtain the bin assignment information. Thus, these selected "zookeeper" nodes have replicated zookeeper database images distributed among different failure domains of nodes in the cluster so that there is no single point of failure of the zookeeper database. In other words, other nodes issue zookeeper requests to their nearest zookeeper database image (zookeeper node) to obtain current bin assignments, which may then be cached at the nodes to improve access times.

For each data block received and stored in NVRAM 230a,b, the slice services 360a,b compute a corresponding bin number and consult the bin assignment table 470 to identify the SSDs 270a,b to which the data block is written. At boxes 408a,b, the slice services 360a,b of the storage nodes 200a,b then issue store requests to asynchronously flush copies of the compressed data block to the block services 340a,b associated with the identified SSDs. An exemplary store request issued by each slice service 360a,b and received at each block service 340a,b may have the following form:

store (block ID, compressed data)

The block service 340a,b for each SSD 270a,b (or storage devices of external storage array 150) determines if the block service as previously stored a copy of the data block. If so, the block service deduplicates the data for storage efficiency. Notably, the block services are configured to provide maximum degrees of data protection offered by the various data protection schemes and still deduplicate the data blocks across the volumes despite the varying data protection schemes among the volumes.

If the copy of the data block has not been previously stored, the block service 340a,b stores the compressed data block associated with the block ID on the SSD 270a,b. Note that the block storage pool of aggregated SSDs is organized by content of the block ID (rather than when data was written or from where it originated) thereby providing a "content addressable" distributed storage architecture of the cluster. Such a content-addressable architecture facilitates deduplication of data "automatically" at the SSD level (i.e., for "free"), except for at least two copies of each data block stored on at least two SSDs of the cluster. In other words, the distributed storage architecture utilizes a single replication of data with inline deduplication of further copies of the data, i.e., there are at least two copies of data for redundancy purposes in the event of a hardware failure.

When providing data protection in the form of replication (redundancy), a slice service 360a,n of the storage node 200 generates one or more copies of a data block for storage on the cluster. Illustratively, the slice service computes a corresponding bin number for the data block based on the cryptographic hash of the data block and consults (i.e., looks up) the bin assignment table 470 to identify the storage nodes to which the data block is to be stored (i.e., written). In this manner, the bin assignment table tracks copies of the data block within the cluster. The slice services of the additional nodes then issue store requests to asynchronously flush copies of the data block to the block services 340a,n associated with the identified storage nodes.

In an embodiment, the volumes are assigned to the slice services depending upon the data protection scheme (DPS). For example, when providing triple replication protection of data, the slice service initially generates three copies of the data block (i.e., an original copy 0, a copy 1 and a copy 2) by synchronously copying (replicating) the data block to persistent storage (e.g., NVRAM) of additional slice services of storage nodes in the cluster. The copies of the data block are then essentially represented as replicas (i.e., an original replica 0, a replica 1 and a replica 2) of the cluster by asynchronously flushing the data block copies to respective block services. Accordingly, a block of a volume may be assigned to an original replica 0 (R0) block service, as well as to a primary replica 1 (R1) block service and a secondary replica 2 (R2) block service. Each replicated data block is illustratively organized within the assigned (allotted) bin that is maintained by the block services of each of the nodes for storage on the storage devices. Each bin is assigned to one or more block services based on the maximum replication scheme; for a triple replication DPS, three block services are assigned to each bin. Each slice service computes a corresponding bin number for the data block and consults (e.g., looks up using the bin number as an index) the bin assignment table 470 to identify the storage nodes to which the data block is written.

When providing data protection in the form of erasure coding, the block services may select data blocks to be erasure coded. When using erasure coding, the storage node uses an erasure code to algorithmically generate encoded blocks in addition to the data blocks. In general, an erasure code algorithm, such as Reed Solomon, uses n blocks of data to create an additional k blocks (n+k), where k is the number of encoded blocks of replication or "parity" used for data protection. Erasure coded data allows missing blocks to be reconstructed from any n blocks of the n+k blocks. For example, an 8+3 erasure coding scheme, i.e. n=8 and k=3, transforms eight blocks of data into eleven blocks of data/parity. In response to a read request, the data may then be reconstructed (if necessary) from any eight of the eleven blocks. Notably, a read is preferably performed from the eight unencoded data blocks and reconstruction used when one or more of the unencoded data blocks is unavailable.

A set of data blocks may then be grouped together to form a write group for erasure coding (EC). Illustratively, write group membership is guided by varying bin groups so that the data is resilient against failure, e.g., assignment based on varying a subset of bits in the bin identifier. The slice services route data blocks of different bins (e.g., having different bin groups) and replicas to their associated block services. The implementation varies with an EC scheme selected for deployment (e.g., 4 data blocks and 2 encoded blocks for correction, 4+2 EC). The block services assign the data blocks to bins according to the cryptographic hash and group a number of the different bins together based on the EC scheme deployed, e.g., 4 bins may be grouped together in a 4+2 EC scheme and 8 bins may be grouped together in an 8+1 EC scheme. The write group of blocks from the different bins may be selected from data blocks temporarily spooled according to the bin. That is, the data blocks of the different bins of the write group are selected from the pool of temporarily spooled blocks by bin so as to represent a wide selection of bins with differing failure domains resilient to data loss. Note that only the data blocks (i.e., unencoded blocks) need to be assigned to a bin, while the encoded blocks may be simply associated with the write group by reference to the data blocks of the write group.

Illustratively, the bins are assigned to the bin group in a manner that optimizes the erasure coding process. For example, in the case of a double redundancy (e.g., 8+2 EC) data protection scheme, wherein three replica versions (original replica 0, primary replica 1, and secondary replica 2) of each bin are generated, the bins in a bin group are assigned such that original replica 0 versions of the bins are assigned across multiple different block services, the primary replica 1 versions of the bins are assigned to a different block service, and the secondary replica 2 versions are assigned to yet another different block service. Data blocks may be stored in the bins in accordance with the replication-based data protection scheme until a sufficient number of blocks are available for the selected erasure coding deployment. One of the different block services functioning as a master replica (master replica block service) coordinates the erasure coding process and selects a data block which is a candidate for erasure coding from each of the bins. The master replica block service forms a write group with the data blocks, which remain unencoded, and generates one or more encoded parity blocks, e.g., primary and secondary encoded parity blocks. As is known to persons of skill in the art, a variety of erasure coding algorithms may be employed, such as Reed-Solomon. The encoded parity blocks may be stored with block identifiers for each of the data blocks used to generate the encoded blocks. Each replica block service updates its metadata mappings for the unencoded copies of the data blocks to point to (i.e., reference) the encoded data block (e.g., the primary and secondary encoded parity blocks) locations on storage devices so that any read requests for the data blocks can return the encoded blocks. Notably, the encoded block may be enumerated (i.e., primary, secondary, etc.) to support asymmetric erasure coding schemes. After storing and updating mappings for the encoded blocks, the master replica block service may free up the storage space occupied by the unencoded additional replicas of the data blocks in the write group while maintaining replica 0.

In order to satisfy the data integrity guarantees while increasing available storage space (i.e., reducing unnecessary storage of duplicate data blocks), the storage nodes perform periodic garbage collection (GC) for data blocks to increase storage in accordance with currently applicable DPS. Slice services of the storage nodes manage the metadata for each volume in slice files and, at garbage collection time, generate lists or Bloom filters for the DPS. The Bloom filters identify data blocks currently associated with the DPS and the block services use the Bloom filters to determine whether the DPS for any data blocks that they manage may have changed.

An EC implementation may involve aggregating a set of data blocks to form a write group and calculating parity over the data blocks to generate a parity block. Broadly stated, parity calculations involve mathematical processing of information from uniformly sized data blocks to generate an encoded (parity) block. As used herein, the term "encoding" means the computation of a redundancy value (such as a parity block) over a predetermined set of uniformly-sized data blocks, whereas the term "decoding" means the reconstruction of a data or parity block by the same process as the redundancy computation using the set of data blocks and redundancy values. A parity value may be computed by adding and/or subtracting (usually modulo 2) data as well as performing multiplication and/or division calculations on the data composed of bits in corresponding positions on each of the blocks. Illustratively, addition and subtraction on the data bits are equivalent to exclusive-or (XOR) logical operations; whereas multiplication and division may use table lookup operations. Accordingly, such reconstruction consists of the performing parity calculations on all the surviving data and parity blocks. Similarly, if the parity block is lost, the parity block can be recomputed in the same way from the surviving data.

The parity block generated by the parity calculations has substantial entropy (e.g., useful information) that is needed for the reconstruction described above and, thus, does not compress well. In order to realize the benefits of compression, the data blocks may be compressed before calculating parity. Yet for the parity calculations to be successful, all of the data blocks in the write group should be of the same size. If they are not, the smaller sized data blocks may be padded (e.g., filled with a series of null characters, such as zeros) to the size of the largest block in the group. As a result, the parity block is as large as the largest block in the write group which, in turn, may negate the benefit of compression.

Pooling Blocks for Erasure Coding Write Groups

The embodiments described herein are directed to a technique configured to provide efficient data protection, such as erasure coding, for content driven distribution of data blocks of logical volumes ("volumes") served by storage nodes of a storage cluster. A storage node may receive data associated with write requests from clients, wherein the data originate from varying and unpredictable client workload patterns. As noted, the data is received in similar-sized blocks, e.g., 4 KB blocks, by a slice service of the node, compressed, synchronously replicated to the slice services of one or more additional storage nodes, and eventually forwarded to the block services. The compressed data blocks received by the block services may vary in size, e.g., 512 B, 1 KB, 2 KB, 4 KB. The replicated (and compressed) data blocks are then organized within allotted bins that are maintained by the block services of the nodes for storage on the storage devices.

Figure 6:
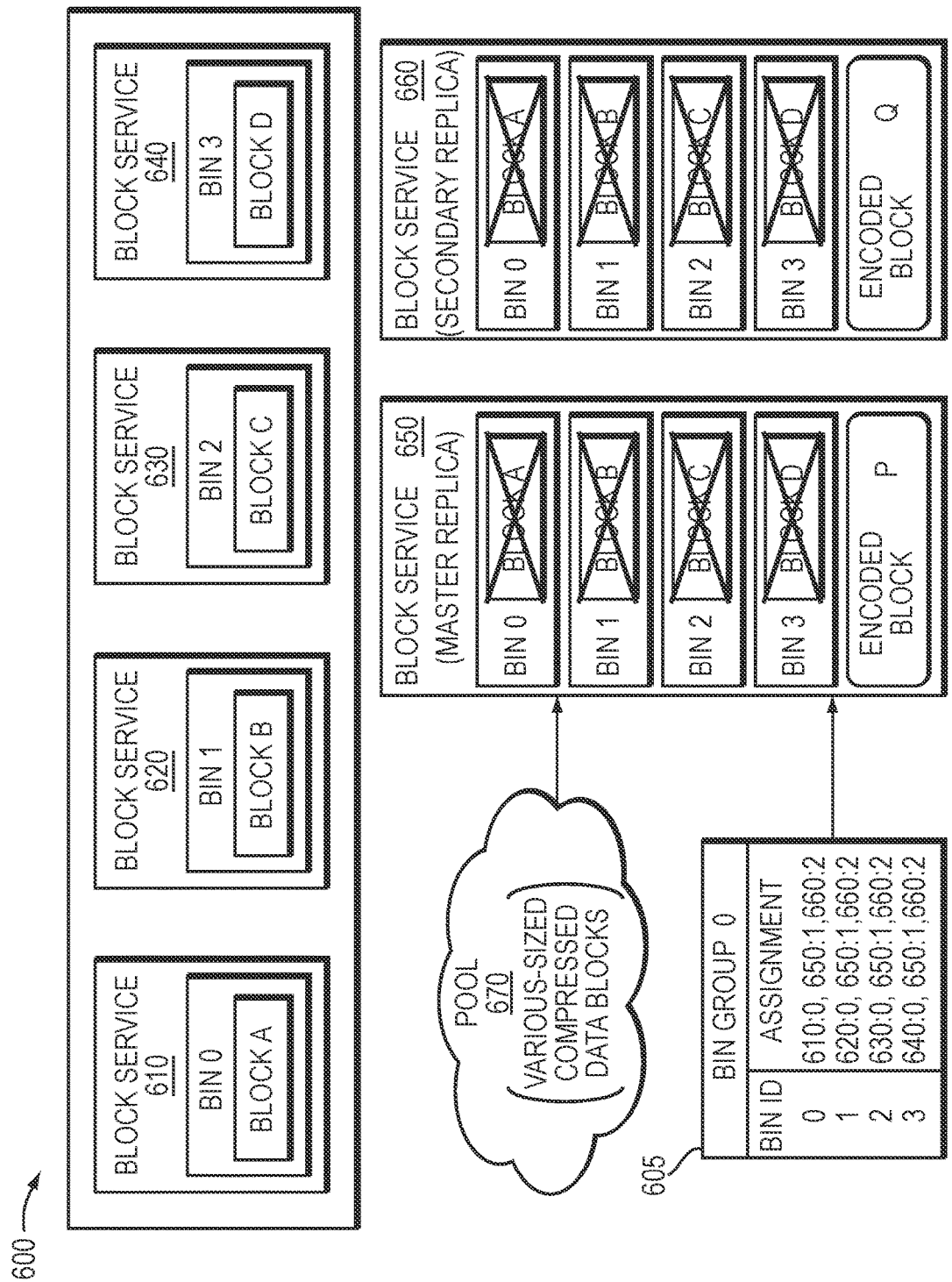
FIG. 6 illustrates an example for providing efficient erasure coding of data blocks selected from a pool of varying sized compressed data blocks.

FIG. 6 illustrates an example 600 for providing efficient erasure coding of data blocks selected from a pool of varying sized compressed data blocks. Illustratively, block services 340 (denoted as block services 610-640) host bins 0-3, i.e., the bins are assigned to and managed by their corresponding block services 610-640. As used herein, a bin group identifies bins (bin IDs) from which data blocks are selected for EC. The number of bins in a bin group corresponds to the number of input data blocks for an EC scheme; for example, a 4+2 EC scheme uses four bins. Thus, a bin group assignment 605 specifies four bin IDs for bin group 0: bin 0, bin 1, bin 2, and bin 3. The bin group assignment 605 also specifies that the primary (master) replica block service 340 (denoted as 650) and a secondary replica block service 340 (denoted as 660) store replicas for each of the bins, as indicated by the assignment notations "650:1" and "660:2." That is, the master replica block service 650 stores (hosts) replica 1 for each bin 0-3 in the bin group 0, and the secondary replica block service 660 hosts replica 2 for each bin 0-3 in the bin group 0.

In an embodiment, the bin group assignment 605 is maintained in bin assignment table 470 of the zookeeper database 450 and may be generated by a master/manager of the cluster 100 ("cluster master/manager") or other service (e.g., a bin assignment service not depicted) which performs bin assignments. The bin assignment service ensures that (i) each original replica 0 version of bins selected for a bin group is assigned to a different block service (e.g., bins 0-3 are assigned across block services 610-640), (ii) the primary replica 1 versions of the bins are assigned to a same block service (e.g., all of the replica 1's are assigned to the master replica block service 650) and (iii) the secondary replica 2 versions of the bins are assigned to a same block service (e.g., all of the replica 2's are assigned to the secondary replica block service 660).

The bin assignment service may also assign the bins in such a manner that the bins are located across different failure domains. For example, each bin may be assigned to or selected from a different SSD, a different storage node, and/or a different chassis of storage nodes. Moreover, the bin assignment service may ensure that no block service hosts multiple replicas for the same bin. The bin assignment service makes the bin group assignment 605 available to all block services including the primary and secondary replica block services 650 and 660, respectively. A designated block service hosts a primary encoded replica and, thus, functions as the master replica block service 650 that uses the bin group assignment 605 to coordinate the erasure coding process, whereas another designated block service hosts a secondary encoded replica and functions as the secondary replica block service 660.

To provide data protection in the form of EC, the block services (e.g., master block services for each bin) select a set of compressed data blocks from appropriate bins to form a write group. In an embodiment, the master replica block service 650 coordinates the EC process by, e.g., determining that there is an available data block from each bin in the bin group for erasure coding. For example, the master replica block service 650 identifies data blocks A-D as available for EC and forms a write group with the blocks A-D. The master replica block service 650 may analyze a data protection bit mask associated with each block that identifies the applicable data protection scheme to determine that the blocks may be erasure coded. The block service 650 may then apply an erasure code to the write group to algorithmically generate one or more encoded (e.g., parity) blocks in addition to the data blocks. If a plurality of compressed data blocks (e.g., 4 data blocks) is "blindly" selected from the appropriate bins (e.g., following appropriate erasure coding rules), various sized blocks may be selected as members of the write group. To be as space efficient as possible with the parity blocks, compressed data blocks of similar size are preferably used to form the write group, which would obviate padding of the blocks. However, due to the unpredictability of data content and size in client write requests that vary with data workload patterns, the compressed data blocks have varying sizes.

According to the technique, a collection or "pool" 670 of the various-sized compressed data blocks is established and maintained from which the data blocks of the write group are selected. That is, instead of erasure coding the compressed data blocks "inline" with the write path operations described above, the technique organizes the blocks in a pool 670 of various-sized compressed data blocks to enable subsequent matching of similar-sized compressed data blocks to form the write group. For example, the various-sized blocks of the pool may be sorted by size or by varying degrees of size granularity, e.g., 256 B, 512 B, 1 KB, which may be adjusted dynamically according a frequency that a block size appears in a data workload pattern, e.g., a 768 B block size may be added to the organized sizes of blocks. More specifically, the establishment and maintenance of the pool enables selection, e.g., by the master replica block service 650, of compressed data blocks that are similar-sized (i.e., substantially close to the same size) and, thus, require minimal padding.

Upon selecting a group of similar-sized blocks A-D, the master replica block service 650 "pads-out" each compressed data block, as needed, to the largest block size and algorithmically generates one or more encoded parity blocks by, e.g., performing parity (encoding) calculations on the data blocks to generate one or more corresponding parity blocks. Specifically, the block service 650 generates and writes an encoded block P within its own storage, and then generates and writes an encoded block Q to the secondary replica block service 660. The master replica block service 650 reads its unencoded copies of the data blocks A-D and processes them using an erasure coding algorithm to generate the encoded parity blocks P and Q. The master replica block service 650 may update metadata entries, e.g., of respective map fragments, for the data blocks A-D with a mapping that points to the encoded parity block P on the BSD of the block service 650 in addition to the existing location mappings for the data blocks. The secondary replica block service 660 similarly updates its mappings for the data blocks to include the location of the encoded parity block Q on the BSD of the block service 660. The encoded parity blocks are also stored with block IDs of the data blocks in the write group, i.e., data blocks A-D used to generate the encoded parity blocks. Thereafter, the master replica block service 650 may delete the unencoded copies of the data blocks A, B, C, and D from the block service 650, and the secondary replica block service 660 may delete the unencoded copies of the data blocks A, B, C, and D from the block service 660. Since the encoded parity blocks P and Q have been generated, the data blocks A-D are now protected by a 4+2 EC scheme and can still be read (recovered) even after two failures. As a result, the unencoded copies of the data blocks may be deleted to free up storage space.

In an embodiment, organization of the compressed data blocks as a pool 670 for each allotted bin allows a reasonable number of blocks to be available for garbage collection (GC). That is, when invoking GC to remove a data block from a write group, it is desirable to replace that block with a similar-sized (or smaller) compressed block in order to maintain storage efficiency. If the size of the compressed replacement block is larger than the removed block, the replacement block may become the largest block in the write group, thereby requiring retrieval of each constituent data block member of the group to recalculate parity for the parity block(s). By maintaining a sufficient number of compressed data blocks in the pool 670, it is likely that a replacement block can be selected from the pool that fits fairly well into the write group.

Figure 7:
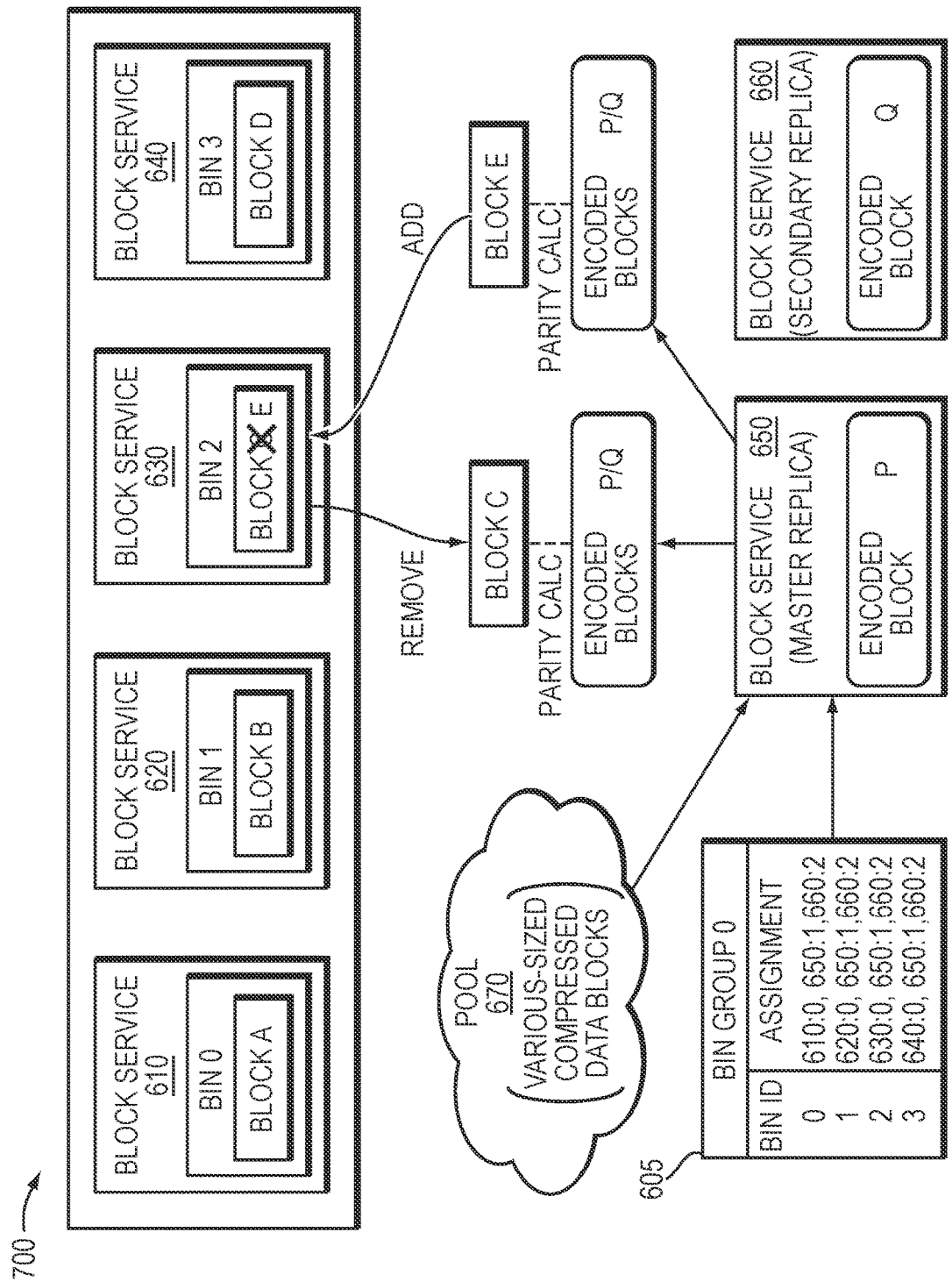
FIG. 7 illustrates an example for efficiently removing a data block from a write group and adding a data block from the pool for erasure coding.

According to the technique, establishment and maintenance of the pool 670 of various-sized compressed data blocks allows the write group to maintain per-block granularity (i.e., a same block size for blocks of the write group) in the event the master replica block service 650 removes and/or adds a data block from/to the write group. FIG. 7 illustrates an example 700 for efficiently removing a data block from a write group and adding a data block from the pool 670 for erasure coding. Assume that during GC, the master replica block service 650 removes a data block, e.g., block C, from the write group of 4 data blocks and 2 parity blocks, i.e., in the 4+2 EC scheme described above. To remove block C from the write group with encoded parity blocks P and Q generated from parity calculations, the block service 650 requires only the removed data block and the parity block(s). That is, the master replica block service 650 performs parity calculations only on the block C with the parity blocks P/Q to remove the data block C from the write group. Similarly, the block service 650 may add (insert) a data block to the write group by selecting a similar-sized replacement data block, e.g., block E, from the pool 670 and performing parity calculations on the block E with the parity blocks P/Q. Here, a best-match algorithm may be invoked to attempt formation of the write group having substantially similar-sized blocks (e.g., based on size difference threshold), which may negate padding of one or more blocks selected from the pool.

In an embodiment, there may be a situation where the data blocks of a write group are not exactly matched in size and require a minimal amount of padding to form the group. Here, a threshold number (denoted as N) of compressed data blocks may be maintained in the pool 670 and once the number of blocks in the pool exceeds the threshold N, a set of data blocks having a minimal delta (variation) in size may be collected to form the write group. The compressed data blocks may be padded out to the largest block size, if needed, and an erasure code may be applied to the group to algorithmically generate one or more parity blocks.

Illustratively, a compressed data block may reside in the pool 670 of varying sized blocks in unencoded form and not be used in a write group without degradation of durability in the event of node failure. This is because each unencoded data block is received by the block services in replicated form and is protected to the same degree as provided by EC. Accordingly, a compressed data block may reside in the pool 670 for an extended (possibly infinite) period of time if there are no similar size matches for the block in a write group. That is, compressed data blocks residing in the pool for different periods of time (i.e., blocks having different ages) may be selected for inclusion in a write group. Indeed, an aspect of the technique described herein involves the expectation that a certain number of compressed data blocks remain unencoded in the pool for long time periods, so such that compressed data blocks of different ages according to a time of reception of their associated write requests may be included in a same write group. Yet, although a compressed data block may reside in the pool 670 for an extended period of time, another data block of the pool may be quickly selected for inclusion in a write group of data blocks. Notably, a selection bias for older blocks residing longer in the pool may be performed (e.g., select an oldest block of a given size).

While there have been shown and described illustrative embodiments for providing efficient erasure coding for data blocks of volumes served by storage nodes of a cluster, it is to be understood that various other adaptations and modifications may be made within the spirit and scope of the embodiments herein. For example, embodiments have been shown and described herein with relation to establishment and maintenance of a pool of the various-sized compressed data blocks from which the data blocks of the write group are selected. However, the embodiments in their broader sense are not so limited, and may, in fact, allow for organizing the compressed data blocks into a plurality of pools, each of which contains unencoded blocks of substantially similar, but different, sizes.

For instance, the technique described herein may organize the unencoded compressed data blocks into four (4) pools, wherein a first pool contains unencoded blocks of approximately 512 B in size (e.g., less than or equal to 512 B in size), a second pool contains unencoded blocks of approximately 1 KB in size (e.g., greater than 512 B in size, but less than or equal to 1 KB in size), a third pool contains unencoded blocks of approximately 2 KB in size, and a fourth pool contains unencoded blocks of approximately 4 KB in size. That is, each pool has a nominal (i.e., target) size of compressed data blocks such that the various-size compressed data blocks in each pool fall within a respective size range of the respective pool. Illustratively, the pools may be determined according to varying degrees of size granularity, e.g., 256 B, 512 B, 1 KB, which may be adjusted dynamically according a frequency that a block size appears in a data workload pattern, e.g., a 768 B block size may be added to a set of pools. Although certain blocks may "linger" in one or more pools for extended periods of time waiting to be matched to similar-sized blocks in order to form a write group, those blocks are "safely" protected by replication as described herein.

Each pool may be configured with a threshold N of various sized data blocks that are unencoded and compressed. Once the threshold N is exceeded, the best-match algorithm may be invoked to attempt formation of a write group having similar-sized blocks, which may negate padding of one or more blocks selected from the pool. Note that size difference threshold (i.e., variation or difference in sizes) of the blocks may be used by the best-match algorithm. If the collection of unencoded blocks provide a sufficient sampling of various sizes, there may not be substantial padding needed for EC than used in a typical RAID implementation. Furthermore, by maintaining a per-block granularity and addressability within the pool, the technique enables efficient processing of the compressed data blocks for GC operations.

Advantageously, the technique described herein is directed to generating parity blocks having sizes that are as small as possible by reducing the amount of padding needed for the data blocks of the write groups. In addition, maintenance of a pool of various sized data blocks facilitates reduction of padding because data blocks of a substantially similar size may be selected from the pool(s) to form the write groups. In other words, the technique described herein is not concerned with the actual size of the data blocks used to form a write group, but rather that each of the data blocks used to form the group is close to a same size. Moreover, the compressed data blocks inherit the properties of replication and thus exhibit enhanced data protection, better degraded read performance and the same reliability as erasure coding, i.e., despite being unencoded when residing in the pool(s). Yet, the compressed data blocks of the pool(s) are well positioned for inclusion in a write group to increase (e.g., optimize) storage efficiency. Thus, the establishment and maintenance of one or more pools of compressed data blocks is advantageous for both erasure coding (in the context of write group formation) and garbage collection. Notably, a significant characteristic of the pool is the number of blocks that are unencoded, rather than which blocks are unencoded.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software encoded on a tangible (non-transitory) computer-readable medium (e.g., disks, electronic memory, and/or CDs) having program instructions executing on a computer, hardware, firmware, or a combination thereof. Accordingly, this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A system comprising:
a node of a storage cluster coupled to one or more storage devices; and
a processor included in the node, the processor executing instructions configured to:
compress data associated with write requests into data blocks of various sizes, the write requests being received at the node;
organize the various-sized compressed data blocks into a plurality of pools;
select a set of compressed data blocks from one of the plurality of pools to form a write group; and
apply an erasure code to the selected compressed data blocks to algorithmically generate one or more encoded blocks of the write group.

2. The system of claim 1, where each pool comprises: data blocks having a size within a predefined size range.

3. The system of claim 2, wherein a granularity of the predefined size range is dynamically adjusted based on frequency of occurrence of a block size in a data workload pattern.

4. The system of claim 2, wherein the predefined size range is a multiple of 256 bytes.

5. The system of claim 1 wherein selection of the compressed data blocks from one of the plurality of pools reduces padding of the blocks.

6. The system of claim 1 wherein a first compressed block and a second compressed block of the write group have a different age within the pool.

7. The system of claim 1 wherein the processor executing instructions to maintain the pool of various-sized compressed data blocks further executes instructions configured to remove a compressed data block from the write group and add a replacement data block to the write group using operations only on the encoded blocks of the write group.

8. The system of claim 7 wherein the operations are parity calculations.

9. The system of claim 7 wherein the processor executing instructions to use operations only on the encoded blocks of the write group further executes instructions configured to perform parity calculations on the compressed data block with the encoded blocks to remove the compressed data block from the write group.

10. The system of claim 7 wherein the processor executing instructions to use operations only on the encoded blocks of the write group further executes instructions configured to perform parity calculations on the replacement data block with encoded parity blocks to add the replacement data block from the write group.

11. A method comprising:
compressing data associated with write requests into data blocks of various sizes, the write requests being received at a node of a storage cluster;
organizing the various-sized compressed data blocks into a plurality of pools;
selecting a set of compressed data blocks from one of the plurality of pools to form a write group; and
applying an erasure code to the selected compressed data blocks to generate one or more encoded blocks of the write group for redundancy of the compressed data blocks.

12. The method of claim 11, further comprising:
assigning data blocks having a size within a predefined range to a particular pool.

13. The method of claim 12, further comprising:
adjusting a granularity of the predefined size range based on frequency of occurrence of a block size in a data workload pattern.

14. The method of claim 12, further comprising:
assigning a multiple of 256 bytes as the block size for each of the predefined ranges.

15. The method of claim 11, further comprising:
padding one or more of the blocks selected from the one of the plurality pools to minimize padding while forming the write group.

16. The method of claim 11, further comprising:
selecting a first compressed block and a second compressed block having different ages within the pool.

17. The method of claim 11, further comprising:
removing a compressed data block from the write group and adding a replacement data block to the write group using operations only on the encoded blocks of the write group.

18. The method of claim 17 wherein the operations are parity calculations.

19. The method of claim 17, further comprising:
calculating parity on the compressed data block with the encoded blocks to remove the compressed data block from the write group.

20. The method of claim 17, further comprising:
calculating parity on the replacement data block with encoded parity blocks to add the replacement data block from the write group.

* * * * *